(12) United States Patent
Goudo

(10) Patent No.: US 7,176,744 B2
(45) Date of Patent: Feb. 13, 2007

(54) SEMICONDUCTOR DEVICE

(75) Inventor: Shinsuke Goudo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 30 days.

(21) Appl. No.: 11/105,394

(22) Filed: Apr. 14, 2005

(65) Prior Publication Data
US 2006/0077000 A1  Apr. 13, 2006

(30) Foreign Application Priority Data
Oct. 8, 2004   (JP) ............................. 2004-295676

(51) Int. Cl.
*H03K 17/687* (2006.01)
(52) U.S. Cl. .................. 327/434; 327/110; 123/644
(58) Field of Classification Search ............ 327/434, 327/432, 440, 108, 110, 309, 365; 123/644, 123/651
See application file for complete search history.

(56) References Cited
U.S. PATENT DOCUMENTS

| 6,218,709 B1 | 4/2001 | Yasuda |
| 6,275,093 B1* | 8/2001 | Shekhawat et al. ......... 327/434 |
| 6,336,448 B1* | 1/2002 | Furuhata et al. ............ 123/644 |
| 6,441,463 B2 | 8/2002 | Yasuda |
| 6,684,867 B2* | 2/2004 | Ito et al. ..................... 123/644 |

FOREIGN PATENT DOCUMENTS

| JP | 2000-183341 | 6/2000 |
| JP | 2002-4991 | 1/2002 |
| JP | 2002-16254 | 1/2002 |

* cited by examiner

*Primary Examiner*—Dinh T. Le
(74) *Attorney, Agent, or Firm*—Buchanan Ingersoll & Rooney PC

(57) ABSTRACT

A gate discharge resistor part is connected to the gate of an IGBT (Insulated Gate Bipolar Transistor). A timer circuit has its output connected to the input of the gate discharge resistor part and the input of a gate driving circuit. When an ON signal for driving the IGBT into an ON state stays input over a predetermined time period, the timer circuit outputs an H-level signal to the gate discharge resistor part and gate driving circuit. The gate driving circuit drives the IGBT into the OFF state based on the signal from the timer circuit. The gate discharge resistor part changes its resistance from a value given by a first resistor to a value given by a composite resistance of the first and second resistors.

9 Claims, 9 Drawing Sheets

F I G . 1
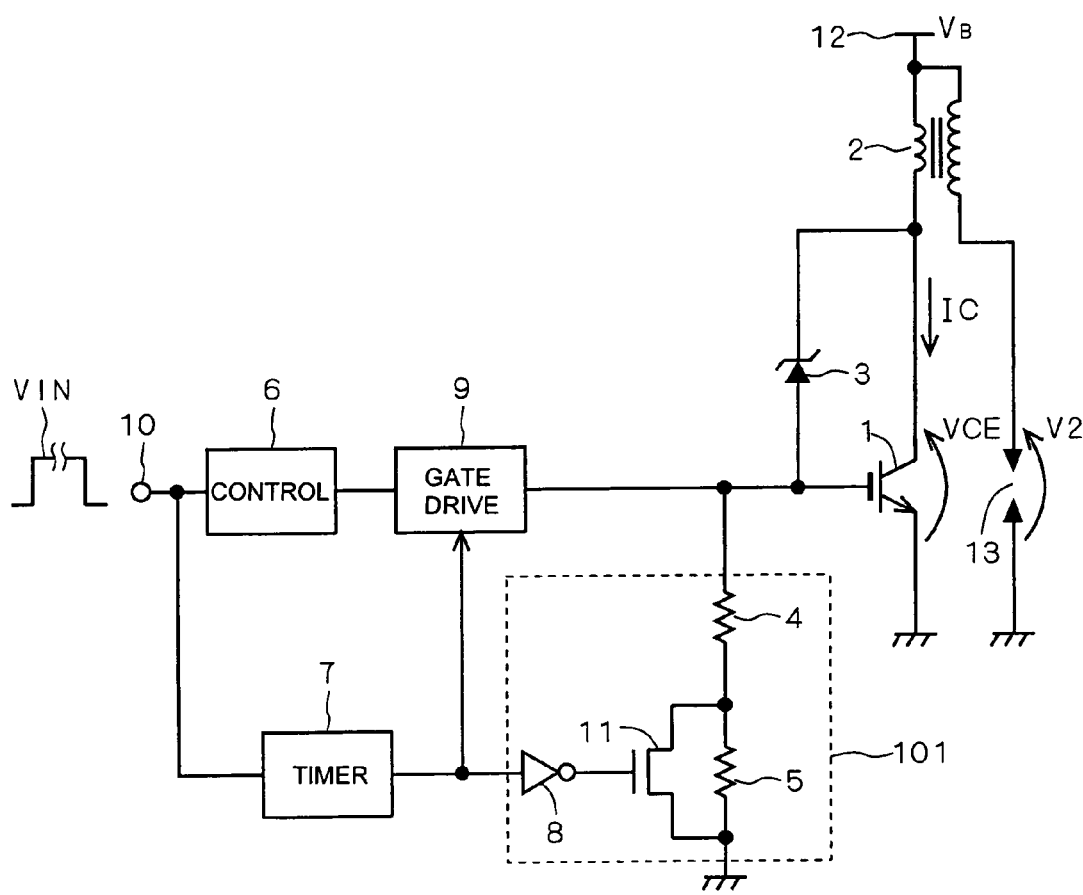

F I G . 7
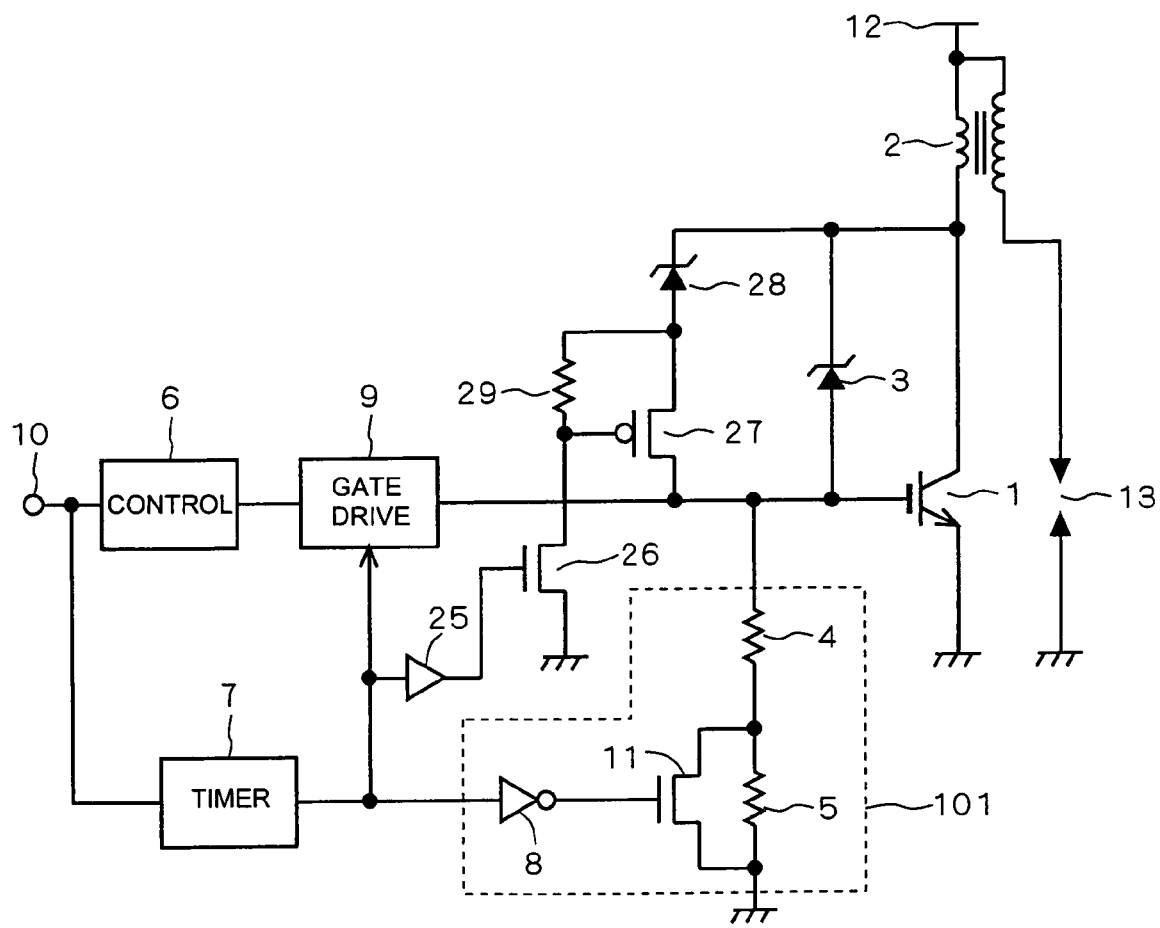

SEMICONDUCTOR DEVICE

BACKGROUND OF THE INVENTION

1. Field of the Invention

The present invention relates to a semiconductor device, and more particularly, to a technique of controlling overvoltage generated in an inductive load when forcedly stopping a switching device especially for the sake of protecting the semiconductor device.

2. Description of the Background Art

An ignition system for an internal combustion engine such as an automobile engine has a problem in that a control signal is held "on" due to a misoperation or the like during maintenance, causing a switching device for controlling current in an inductive load (e.g., transformer or load coil) to be kept conducting, which results in degradation in characteristics or breakdown of a semiconductor device itself or load due to heat generation.

Provided to solve this problem is a function of forcedly stopping a switching device using a timer circuit which operates after a lapse of a predetermined time period (approximately several hundred milliseconds) from the start of an ON operation. In other words, it is possible to avoid breakdown of the switching device by means of the timer circuit in the case where an ON signal stays output over a predetermined time period after the start of an ON operation due to a misoperation or the like.

In this case, a forced current interruption in the switching device may generate a great induced electromotive force in an inductive load, causing arc discharge to take place in an ignition coil with timing that a computer for controlling the ignition of an internal combustion engine is not intended to follow.

Accordingly, a ignition system limits a current interruption speed of a switching device to no more than a certain speed to control the degree of an induced electromotive force generated in an inductive load (cf. Japanese Patent Application Laid-Open No. 2002-4991).

Generally, however, output current is not linearly proportional to the gate voltage in a switching device. For instance, in an MOS gate device, output current is proportional to the square of the gate voltage. Therefore, a complicated circuit configuration and adjustment is required in order to control the switching device such that the current interruption speed is limited to no more than a certain speed.

For instance, the invention disclosed by the above-mentioned JP 2002-4991 controls an interruption speed of output current by means of the capacitance charging time. Since a large-capacitance capacitor is required to reduce the interruption speed of output current, it is difficult to reduce the circuit area. Further, an induced electromotive force varies depending on the inductance of an inductive load, which makes it necessary to vary the capacitance of the capacitor depending on the inductance of the inductive load. Therefore, it is difficult to control the induced electromotive force to be a desired clamping voltage without depending on the inductance of the inductive load.

Furthermore, when the potential at a current input terminal rises due to some unusual event while switching device is conducting, output current may increase, which causes damage to the switching device.

SUMMARY OF THE INVENTION

It is an object of the present invention to provide a technique of controlling an induced electromotive force generated in an inductive load when forcedly interrupting a switching device, with a simple circuit configuration.

It is another object of the present invention to provide a technique of controlling an induced electromotive force with high accuracy to be a desired clamping voltage irrespective of the inductance of the inductive load when forcedly interrupting the switching device.

It is still another object of the present invention to provide a technique of avoiding combustion of a switching device due to voltage rise at a current input terminal when the switching device is in an ON state.

According to a first aspect of the present invention, a semiconductor device includes a switching device having a current input terminal connected to an inductive load, a clamping device connected between a control terminal and the current input terminal of the switching device, and a discharge resistor part connected between the control terminal of the switching device and a ground potential. The switching device is driven to generate an induced electromotive force in the inductive load. The semiconductor device further includes a timer circuit for outputting a predetermined signal to the discharge resistor part when an ON signal for driving the switching device into an ON state stays input over a predetermined time period. The discharge resistor part changes its resistance to a greater value in response to the predetermined signal.

Since the discharge resistor part increases in resistance even when the switching device is forcedly driven into the OFF state in response to the predetermined signal output from the timer circuit, the switching device is held in the ON state by leakage current flowing through the clamping device, which can avoid abrupt interruption of collector current. Therefore, it is possible to control the degree of induced electromotive force generated in the inductive load without requiring a complicated circuit configuration for gradually interrupting the collector current.

According to a second aspect of the present invention, a semiconductor device includes a switching device having a current input terminal connected to an inductive load, a first clamping device connected between a control terminal and the current input terminal of the switching device, and a discharge resistor part connected between the control terminal of the switching device and a ground potential. The switching device is driven to generate an induced electromotive force in the inductive load. The semiconductor device further includes a timer circuit for outputting a predetermined signal when an ON signal for driving the switching device into an ON state stays input over a predetermined time period, and a second clamping device selectively connected between the control terminal and the current input terminal of the switching device in response to the predetermined signal. The second clamping device has a breakdown voltage smaller than a breakdown voltage in the first clamping device.

Voltage between the control terminal and current input terminal of the switching device can be clamped by the second clamping device at a breakdown voltage smaller than a breakdown voltage in the first clamping device even when the switching device is forcedly driven into the OFF state in response to the predetermined signal output from the timer circuit.

According to a third aspect of the present invention, a semiconductor device includes a switching device having a current input terminal connected to an-inductive load, a first clamping device connected between a control terminal and the current input terminal of the switching device, and a discharge resistor part connected between the control terminal of the switching device and a ground potential. The switching device is driven to generate an induced electromotive force in the inductive load. The semiconductor device further includes a second clamping device having one end connected to the current input terminal of the switching device, a transistor having a current input terminal connected to the other end of the second clamping device and a current output terminal connected to the control terminal of the switching device, a third clamping device having one end connected to the current input terminal of the transistor and the other end connected to the ground potential, and an overvoltage detecting circuit connected to the one end of the third clamping device. The overvoltage detecting circuit outputs a signal for driving the switching device into an OFF state when a breakdown voltage is applied to the third clamping device.

In the case where voltage at the current input terminal rises when the switching device is in the ON state, the switching device is forcedly brought into the OFF state. This can avoid combustion of the switching device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a configuration of a semiconductor device according to a first preferred embodiment of the present invention;

FIG. 7 is a circuit diagram showing a configuration of a semiconductor device according to a second preferred embodiment of the present invention;

DESCRIPTION OF THE PREFERRED EMBODIMENTS

First Preferred Embodiment

Figure 2:
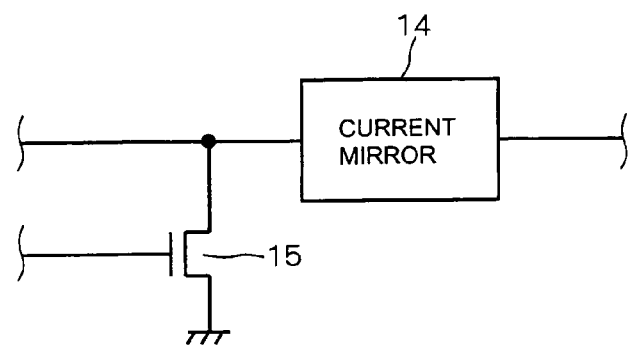
FIG. 2 is a circuit diagram showing a configuration of a gate driving circuit for use in the semiconductor device according to the first preferred embodiment.

FIG. 1 is a circuit diagram showing a configuration of a semiconductor device according to the present embodiment. A control circuit 6 has its input connected to an input terminal 10 and its output connected to the input of a gate driving circuit 9. The gate driving circuit 9 has its output connected to the gate (control terminal) of an IGBT (Insulated Gate Bipolar Transistor) 1 serving as a switching device.

Upon receipt of an input signal VIN through the input terminal 10, the control circuit 6 controls the input signal VIN in response to a signal sent from a monitoring circuit (not shown) for monitoring the driving status of the IGBT 1, to output a control signal to the gate driving circuit 9. The gate driving circuit 9 drives the gate of the IGBT 1 in response to the control signal.

The IGBT 1 has its collector (current input terminal) connected to one end of a primary coil constituting a load coil (inductive load) 2 and the cathode of a Zener diode (clamping device, first clamping device) 3, and the emitter of the IGBT 1 is grounded. The primary coil has the other end connected to a power source 12. The Zener diode 3 has its anode connected to the gate of the IGBT 1. A secondary coil of the load coil 2 has one end connected to the power source 12 and the other end connected to one end of an ignition coil 13. The other end of the ignition coil 13 is grounded.

The Zener diode 3 is connected to clamp the collector-emitter voltage in the IGBT 1 at a predetermined voltage (e.g., approximately 500V) or lower in order to avoid breakdown of the load coil 2, and is constructed from Zener diodes connected in several tens of levels each having a breakdown voltage approximately ranging from 7 to 8V.

A resistor 4 has one end connected to the gate of the IGBT 1 and the other end connected to the drain of an NMOS transistor 11. The source of the NMOS transistor 11 is grounded. A resistor 5 is connected between the source and drain of the NMOS transistor 11. The resistance of the resistor 5 is set at such a value that leakage current in the Zener diode 3 turns the IGBT 1 on.

An inverter 8 has its output connected to the gate of the NMOS transistor 11, and a timer circuit 7 has its output connected to the input of the inverter 8. The output of the timer circuit 7 is also connected to the gate driving circuit 9. The resistors 4, 5, inverter 8 and NMOS transistor 11 constitute a gate discharge resistor part 101 (discharge resistor part). The timer circuit 7 has its input connected to the input terminal 10, and receives power from the input signal VIN.

The timer circuit 7 usually outputs an L-level signal, and upon receipt of an ON signal through the input terminal 10, carries out a timing operation. More specifically, in the case where an ON signal stays input due to a misoperation or the like during a maintenance operation, the timer circuit 7 outputs an H-level signal after a lapse of a predetermined time period from the start of input of the ON signal. In the case where an ON signal does not stay input over a predetermined time period, the timer circuit 7 continues outputting an L-level signal. That is, the timer circuit 7 is configured to output a predetermined signal (an H-level signal in the above case) when an ON signal for driving the IGBT 1 stays input over a predetermined time period.

Next, referring to FIG. 2, a configuration of the gate driving circuit 9 will be described. A current mirror circuit 14 has its input connected to the output of the control circuit 6, and its output connected to the gate of the IGBT 1. An NMOS transistor 15 has its drain connected to the input of the current mirror circuit 14, and its source grounded. The gate of the NMOS transistor 15 is connected to the output of the timer circuit 7.

Figure 3:
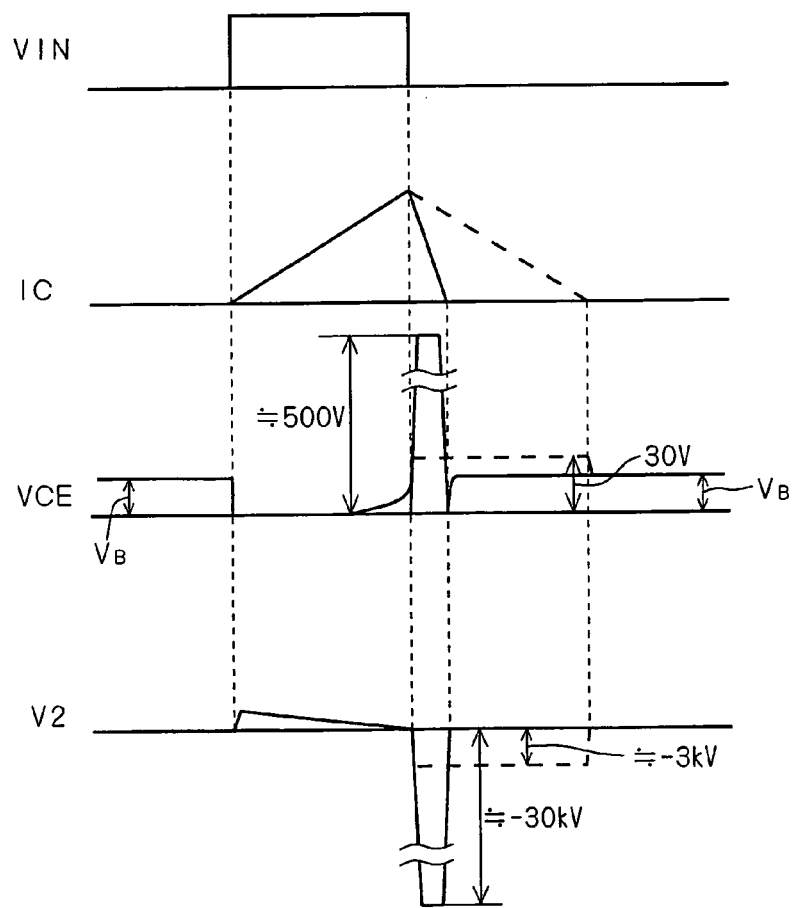
FIG. 3 is a waveform chart of an operation of the semiconductor device according to the first preferred embodiment.

An operation of the semiconductor device of the above configuration will be described now. FIG. 3 is a waveform chart of the operation of the semiconductor device according to the present embodiment. The operation of the semiconductor device is divided into two operations: one in a period during which the timer circuit 7 outputs an L-level signal which hereinafter will be called "a normal operation", and the other one in a period during which the timer circuit 7 outputs an H-level signal which hereinafter will be called "a protecting operation".

First, the normal operation of the semiconductor device will be described. In an initial state, collector-emitter voltage VCE of the IGBT 1 is equal to voltage $V_B$ of the power source 12. Voltage V2 of the ignition coil 13 is also equal to the voltage $V_B$.

When the input signal VIN is caused to transition from the L level (OFF signal) to the H level (ON signal), the gate driving circuit 9 drives the gate of the IGBT 1 into H level. Then, the IGBT 1 transitions from the OFF state to the ON state.

The timer circuit 7 outputs an L-level signal. The output of the timer circuit 7 is reversed at the inverter 8 to be input to the gate of the NMOS transistor 11 as an H-level signal. Since the NMOS transistor 11 is brought into the ON state, current flowing in the gate discharge resistor part 101 flows out from the resistor 4 to a ground potential through the NMOS transistor 11. Therefore, the resistance of the gate discharge resistor part 101 becomes almost equal to that of the resistor 4.

With the transition of the IGBT 1 to the ON state, the collector-emitter voltage VCE (which hereinafter may be briefly called "voltage VCE") drops to the ground potential, and collector current IC flowing out from the power source 12 through the load coil 2 and IGBT 1 gradually increases. Thereafter, when the collector current IC increases above a predetermined current value, a current limiting circuit (not shown) operates to limit the current value, causing the voltage VCE to slightly rise.

Next, upon receipt of an OFF signal, the gate driving circuit 9 drives the gate of the IGBT 1 to turn into the L level, causing the IGBT 1 to transition from the ON state to the OFF state. The transition of the IGBT 1 to the OFF state causes the collector current IC flowing through the load coil 2 to be abruptly interrupted as indicated by a solid line, following which an induced electromotive force is generated across the load coil 2, and the voltage VCE suddenly rises.

As described above, the resistance of the gate discharge resistor part 101 is equal to that of the resistor 4. Therefore, a gate voltage of such a level that causes the IGBT 1 to transition to the ON state is not generated by current as small as the leakage current flowing through the Zener diode 3, and the voltage VCE rises with the IGBT 1 held in the OFF state.

When the voltage VCE rises above approximately 500V, a reverse current flows through the Zener diode 3 and resistor 4. A voltage given by a product of the reverse current and the resistance of the resistor 4 is applied to the gate of the IGBT 1, causing the IGBT 1 to transition to the ON state. Then, electric charge is discharged from the load coil 2 as collector current in the IGBT 1. After electric charge is discharged from the load coil 2, and the voltage VCE drops to almost the same level as the clamping voltage, the IGBT 1 transitions again to the OFF state. In this manner, the voltage VCE is clamped at a clamping voltage of approximately 500V by the Zener diode 3.

Next, an induced electromotive force generated on the primary coil side is increased in voltage to approximately −30 kV and is conveyed to the secondary coil side, so that arc discharge takes place in the ignition coil 13. Then, voltage on the primary coil side and voltage on the secondary coil side of the load coil 2 drop, so that the voltage VCE and voltage V2 in the ignition coil 13 both become equal to the voltage $V_B$.

Next, the process of the protecting operation of the semiconductor device according to the present embodiment will be described. After a lapse of a predetermined time period since the input signal VIN is turned into an ON signal, the timer circuit 7 outputs an H-level signal. The signal output from the timer circuit 7 is reversed at the inverter 8, and is input to the gate of the NMOS transistor 11 as an L-level signal. Upon receipt of the L-level signal, the NMOS transistor 11 is turned into the OFF state from the ON state. Accordingly, the resistance of the gate discharge resistor part 101 is equal to a combined resistance of the resistors 4 and 5.

The H-level signal output from the timer circuit 7 is also input to the NMOS transistor 15 (see FIG. 2) of the gate driving circuit 9. Then, the NMOS transistor 15 is turned into the ON state, causing the input of the current mirror circuit 14 to be grounded. Therefore, the output of the current mirror circuit 14 (output of the gate driving circuit 9) is turned into the L level, causing the IGBT 1 to transition to the OFF state. The transition of the IGBT 1 to the OFF state avoids degradation of the IGBT 1 and load coil 2 resulting from continuation of the ON state over a predetermined time period.

With the transition of the IGBT 1 to the OFF state, the collector current IC is gradually interrupted, so that the voltage VCE rises. As described, the resistance of the gate discharge resistor part 101 is equal to the combined resistance of the resistors 4 and 5 as described above. By setting the resistance of the resistor 5, the combined resistance is set at such a value that the IGBT 1 is turned on almost by the leakage current flowing through the Zener diode 3. When the voltage VCE rises to approximately 30 V, a gate voltage of sufficient level for holding the IGBT 1 in the ON state is applied to the gate of the IGBT 1. Therefore, even when the gate driving circuit 9 outputs an L-level signal, the IGBT 1 does not completely transition to the OFF state, and the collector current IC is gradually reduced as indicated by broken lines. When the collector current IC becomes zero, the IGBT 1 is completely turned into the OFF state, and the voltage VCE becomes $V_B$.

As described above, controlling the gate voltage applied in the protecting operation by appropriately selecting the resistance of the resistor 5 limits the voltage VCE not to rise above approximately 30V. Further, as indicated by the broken lines in FIG. 3, the voltage V2 in the ignition coil 13 is also limited not to rise above approximately −3000V, which avoids the occurrence of arc discharge.

Here, the voltage VCE in the protecting operation (referred to as 30V in this example) is assumed to be greater than the voltage $V_B$ (assumed to be the nominal voltage 12V of a general-automotive battery in this case) in the power source 12 and to have such a value that arc discharge dose not take place in the ignition coil 13. In other words, the voltage VCE in the protecting operation may be set at a value in accordance with the value of the voltage $V_B$ in a system to be used and the like.

Figure 4:
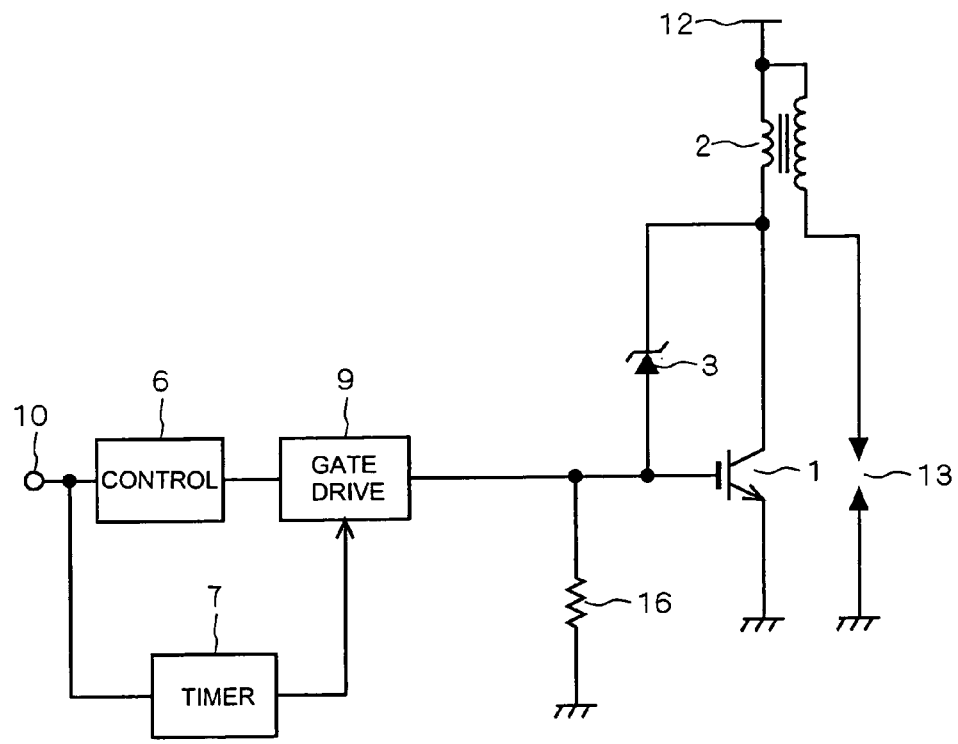
FIG. 4 is a circuit diagram showing a configuration of a semiconductor device of the background art of the invention.

FIG. 4 is a circuit diagram showing an example of a semiconductor device of the background art of the present invention. As shown in FIG. 4, the semiconductor device of the background art is provided with a resistor 16 connected in place of the gate discharge resistor part 101.

Figure 5:
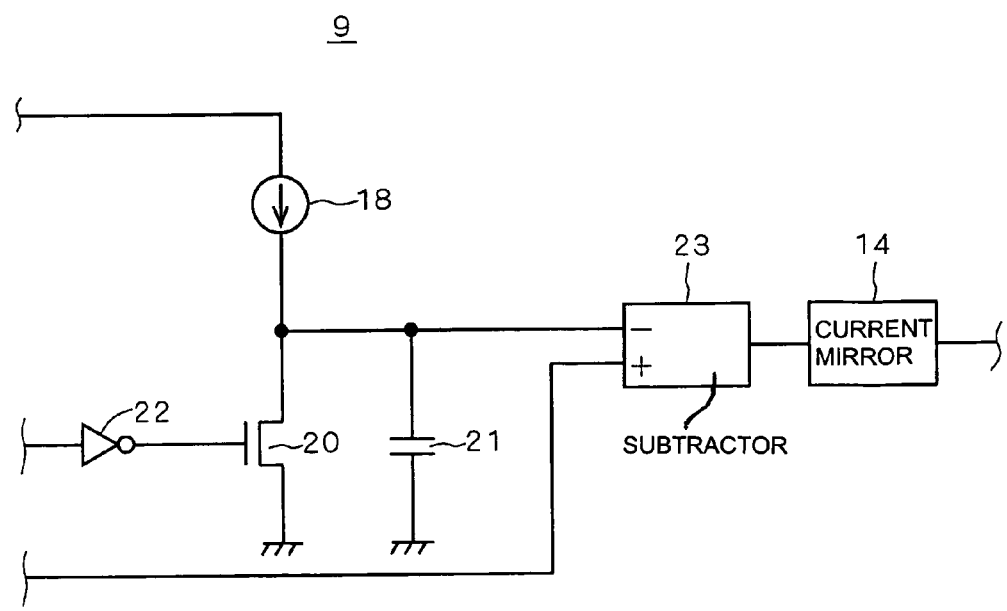
FIG. 5 is a circuit diagram showing a configuration of a gate driving circuit for use in the semiconductor device of the background art.

FIG. 5 is a circuit diagram showing a configuration of the gate driving circuit 9 for use in the semiconductor device of the background art. An inverter 22 has its input connected to the output of the timer circuit 7 (see FIG. 4), and its output connected to the gate of an NMOS transistor 20. The source of the NMOS transistor 20 is grounded, and its drain is connected to one end of a current source 18 and one end of a capacitor 21.

The other end of the current source 18 is connected to a power source not shown, and the other end of the capacitor 21 is grounded. The one end of the capacitor 21 is also connected to a minus terminal of a subtracter 23. The subtracter 23 has its plus terminal connected to the output of the control circuit 6 (see FIG. 4). The current mirror circuit 14 has its output connected to the gate of the IGBT 1. Here, the subtracter 23 is a circuit for outputting current in accordance with a potential difference between the plus and minus terminals.

The operation of the semiconductor device of the background art will be described now. In the normal operation, an L-level signal input from the timer circuit 7 is inverted at the inverter 22, and is input to the gate of the NMOS transistor 20. Therefore, current flowing out from the current source 18 flows to the ground potential through the NMOS transistor 20. An ON signal output from the control circuit 6 is directly input to the current mirror circuit 14 through the subtracter 23. The current mirror circuit 14 amplifies and outputs current output from the subtracter 23. In the ON state of the IGBT 1, current output from the current mirror circuit 14 flows through the resistor 16, so that voltage of sufficient level for holding the IGBT 1 in the ON state is applied to the gate of the IGBT 1.

When an ON signal stays input through the input terminal 10 over a predetermined time period, the timer circuit 7 outputs an H-level signal. Then, the semiconductor carries out the protecting operation. The signal output from the timer circuit 7 is reversed at the inverter 22 (see FIG. 5), and is input to the gate of the NMOS transistor 20, causing the NMOS transistor 20 to transition to the OFF state. When the NMOS transistor 20 transitions to the OFF state, current flowing out from the current source 18 gradually charges the capacitor 21.

As described above, the capacitor 21 has its one end connected to the minus terminal of the subtracter 23. The subtracter 23 outputs current in accordance with a potential difference between a control signal output from the control circuit 6 and a potential at the one end of the capacitor 21. Therefore, output current from the subtracter 23 is gradually reduced. With such reduction, voltage applied to the gate of the IGBT 1 drops, causing the collector current IC flowing through the IGBT 1 to be gradually interrupted.

Upon completion of charging of the capacitor 21, output current from the subtracter 23 is reduced to zero. Thus, output current from the current mirror circuit 14 is also reduced to zero, so that the IGBT 1 is completely brought into the OFF state, causing an interruption of the collector current IC. Since the collector current IC is gradually interrupted, a great induced electromotive force is not generated at the load coil 2, which avoids the occurrence of arc discharge in the ignition coil 13.

As described above, the semiconductor device of the background art employs the subtracter 23 and capacitor 21 to control an interruption speed of output current from the gate driving circuit 9 by a charging speed of the capacitor 21, and is configured to limit an interruption speed of the collector current IC to such a speed that a great induced electromotive force is not generated.

Accordingly, the gate driving circuit 9 has a complicated configuration including the current source 18, capacitor 21, subtracter 23 and the like. To sufficiently reduce the interruption speed of the collector current IC, the capacitor 21 needs to be increased in capacitance, making it difficult to reduce the circuit area of the semiconductor device.

Further, the interruption speed of the collector current IC is controlled by the degree of capacitance of the capacitor 21, making it necessary to set the capacitance of the capacitor 21 in accordance with the number of turns of the load coil 2.

Furthermore, in the case where power for driving the subtracter 23 needs to be obtained from the input signal VIN, power supplied to the subtracter 23 may be reduced due to ground lift or the like, which may cause the subtracter 23 not to operate.

In the present embodiment, it is not necessary to control the interruption speed of output current from the gate driving circuit 9, and output current is simply interrupted when an H-level signal is input from the timer circuit 7. Since there is no need to use a capacitor, the circuit area can be reduced.

The resistance of the resistor 5 is adjusted to control voltage applied to the gate of the IGBT 1, so that the degree of a clamping voltage for clamping the voltage VCE can be controlled. In other words, the voltage VCE can be clamped at a desired clamping voltage irrespective of the inductance of the load coil 2 to be used.

Figure 6:
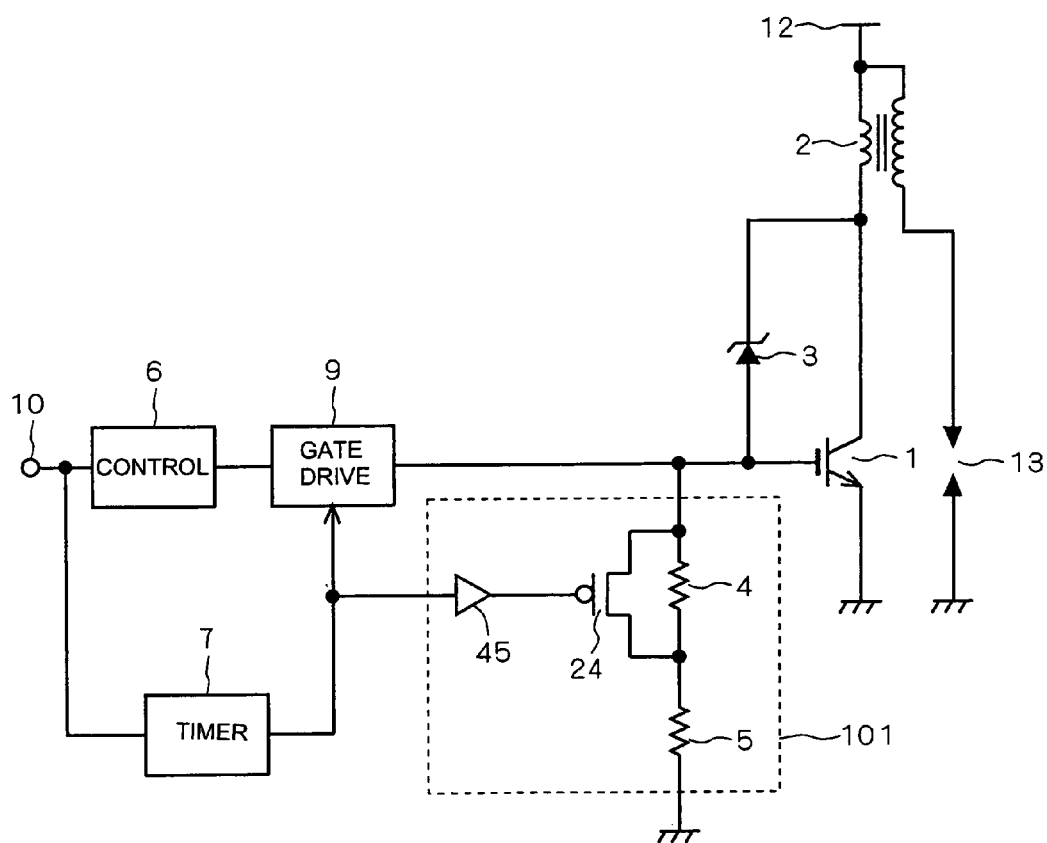
FIG. 6 is a circuit diagram showing another configuration of the semiconductor device according to the first preferred embodiment.

The present embodiment employs the NMOS transistor 11 to constitute the gate discharge resistor part 101, however, a PMOS transistor 24 may be employed instead as shown in FIG. 6.

FIG. 6 shows an exemplary configuration in which the gate discharge resistor part 101 includes the PMOS transistor 24. A buffer 45 has its input connected to the output of the timer circuit 7, and its output connected to the gate of the PMOS transistor 24. The resistor 4 is inserted between the source and drain of the PMOS transistor 24. The PMOS transistor 24 has its source connected to the gate of the IGBT 1, and its drain grounded. In the present embodiment, a resistor of great resistance is used as the resistor 4, and a resistor of small resistance is used as the resistor 5. Other configuration is the same as that of the semiconductor device shown in FIG. 1, repeated explanation of which is thus omitted here. The operation is also the same as that of the configuration shown in FIG. 1, explanation of which is omitted here.

In the above configuration, an IGBT is used as a switching device, however, the present invention is also applicable to a semiconductor device using a power MOSFET or the like. Further, the circuit area can be reduced by forming the components except the load coil 2 on the same semiconductor substrate.

Second Preferred Embodiment

FIG. 7 is a circuit diagram showing a configuration of a semiconductor device according to the present embodiment. A Zener diode 28 (second clamping device) has its cathode connected to the collector of the IGBT 1 and its anode connected to the source of a PMOS transistor 27 and one end of a resistor 29. The PMOS transistor 27 has its drain connected to the gate of the IGBT 1. A breakdown voltage in the Zener diode 28 is set at the same value as the Zener diode 3.

The resistor 29 has the other end connected to the gate of the PMOS transistor 27 and the drain of an NMOS transistor 26. The source of the NMOS transistor 26 is grounded. A buffer circuit 25 has its output connected to the gate of the NMOS transistor 26 and its input connected to the output of the timer circuit 7.

Since other configuration is the same as that described in the first preferred embodiment, similar components are indicated by the same reference numbers, and repeated explanation is omitted here.

The operation of the semiconductor device according to the present embodiment will be described now. In the normal operation, an L-level signal output from the timer circuit 7 is input to the gate of the NMOS transistor 26 through the buffer circuit 25. Thus, the NMOS transistor 26 is in the OFF state. The PMOS transistor 27 is not turned on, and the Zener diode 28 is not connected between the gate and collector of the IGBT 1. Therefore, the gate-collector voltage in the IGBT 1 is clamped by the Zener diode 3. Then, the voltage VCE rises up to about the same level as the clamping voltage in the Zener diode 3, so that discharge takes place at the ignition coil 13.

In the protecting operation, upon receipt of an H-level signal from the timer circuit 7, the NMOS transistor 26 is brought into the ON state. The gate of the PMOS transistor 27 is grounded through the NMOS transistor 26, bringing the NMOS transistor 27 into the ON state. Therefore, the Zener diodes 28 and 3 are connected in parallel between the gate and collector of the IGBT 1.

In the protecting operation, leakage current flowing through the Zener diodes 28 and 3 flows into the resistors 4 and 5, causing the IGBT 1 to be held in the ON state. As a result, similarly to the semiconductor device according to the first preferred embodiment, the collector-emitter voltage VCE is clamped at a desired clamping voltage, which avoids the occurrence of arc discharge in the ignition coil 13.

The semiconductor device according to the present embodiment achieves the following effects in addition to similar effects achieved by the first preferred embodiment.

The configuration according to the first preferred embodiment ensures a gate voltage necessary for turning on the IGBT 1 only by leakage current flowing through the Zener diode 3. It is therefore necessary to set the resistance of the resistor 5 at a great value.

In the present embodiment, leakage current flowing through the Zener diode 28 is added to leakage current flowing through the Zener diode 3, allowing the resistance of the resistor 5 to be set lower than in the first preferred embodiment. Therefore, the circuit area can be reduced more than in the first preferred embodiment.

In the above configuration, an IGBT is used as a switching device, however, the present invention is also applicable to a semiconductor device using a power MOSFET or the like. Further, the circuit area can be reduced by forming the components except the load coil 2 on the same semiconductor substrate.

Third Preferred Embodiment

Figure 8:
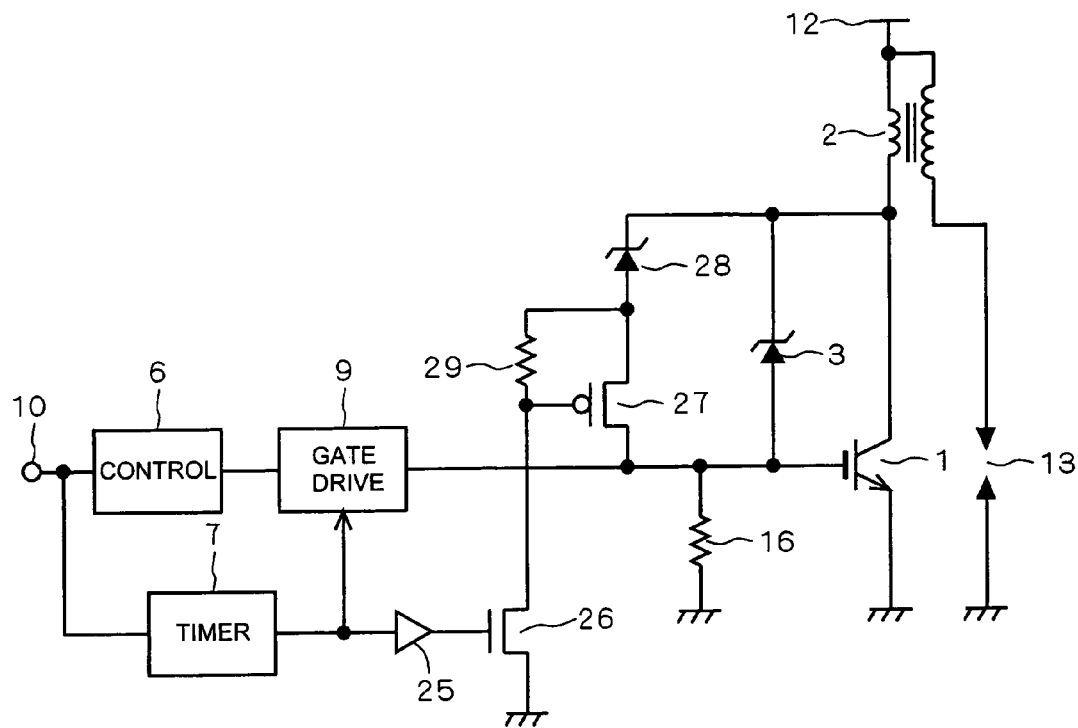
FIG. 8 is a circuit diagram showing a configuration of a semiconductor device according to a third preferred embodiment of the present invention.

FIG. 8 is a circuit diagram showing a configuration of a semiconductor device according to the present embodiment. In the present embodiment, the resistor (discharge resistor part) 16 is connected to the gate of the IGBT 1 in place of the gate discharge resistor part 101. The Zener diode 28 is configured to have a breakdown voltage equal to a desired clamping voltage (e.g., approximately 30V) for clamping the voltage VCE.

Since other configuration is the same as that described in the second preferred embodiment, similar components are indicated by the same reference numbers, and repeated explanation is omitted here.

The operation of the semiconductor device according to the present embodiment will be described now. In the normal operation, an L-level signal output from the timer circuit 7 is input to the gate of the NMOS transistor 26 through the buffer circuit 25. The NMOS transistor 26 is brought into the OFF state, and the gate of the PMOS transistor 27 is not grounded through the NMOS transistor 26, thus brought into the OFF state.

Therefore, the collector-emitter voltage VCE is clamped by the Zener diode 3. That is, the voltage VCE can rise up to approximately 500V, causing the ignition coil 13 to carry out arc discharge.

Next, in the protecting operation, an H-level signal is output from the timer circuit 7. Upon receipt of the signal output from the timer circuit 7, the IGBT 1 is driven into the OFF state, which avoids degradation of the IGBT 1 and load coil 2 resulting from continuation of the ON state.

The output of the timer circuit 7 is also input to the gate of the NMOS transistor 26 through the buffer circuit 25, causing the NMOS transistor 26 to transition to the ON state. The gate of the PMOS transistor 27 is grounded through the NMOS transistor 26, and is brought into the ON state. As a result of the transition of the PMOS transistor 27 to the ON state, the Zener diode 28 is connected between the gate and collector of the IGBT 1 through the PMOS transistor 27.

A breakdown voltage in the Zener diode 28 is set lower than that of the Zener diode 3. Thus, when the IGBT 1 is brought into the OFF state, the collector-emitter voltage VCE is clamped at a clamping voltage which is almost determined by the Zener diode 28.

Since the first and second preferred embodiments utilize leakage current in the Zener diodes, it is difficult to set a desired clamping voltage under temperature conditions of wide range.

In the present embodiment, a desired clamping voltage can easily be achieved under temperature conditions of wide range by appropriately selecting a breakdown voltage in the Zener diode 28.

Figure 9:
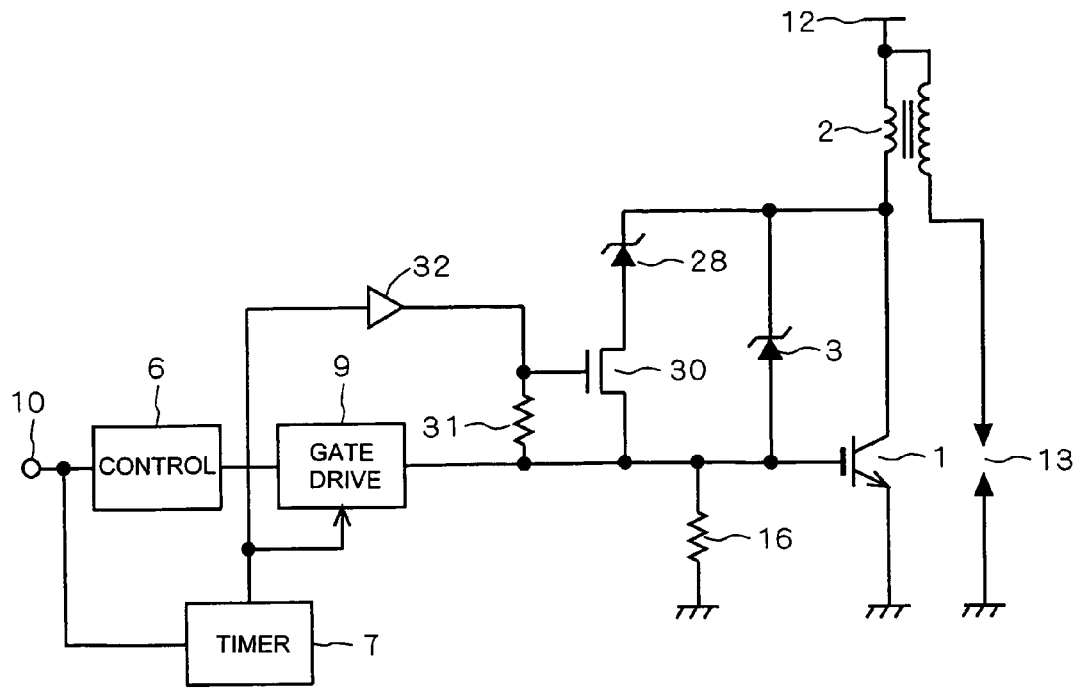
FIG. 9 is a circuit diagram showing another configuration of the semiconductor device according to the third preferred embodiment.

In the present embodiment, the PMOS transistor 27 is connected to the Zener diode 28, however, an NMOS transistor 30 may be employed instead of the PMOS transistor 27 as shown in FIG. 9.

In the circuit configuration shown in FIG. 9, the NMOS transistor 30 has its drain connected to the anode of the Zener diode 28 and its source grounded. One end of a resistor 31 and the output of a buffer 32 are connected to the gate of the NMOS transistor 30. The other end of the resistor 31 is connected to the gate of the IGBT 1. The output of the timer circuit 7 is connected to the input of the buffer 32. Other configuration is the same as that shown in FIG. 8, repeated explanation of which is thus omitted here.

The operation will be described now. In the normal operation, an L-level signal is output from the timer circuit 7, and is input to the gate of the NMOS transistor 30 through the buffer 32. Then, the NMOS transistor 30 is brought into the OFF state, and the gate-collector voltage in the IGBT 1 is clamped by the Zener diode 3 in the normal operation.

Next, when an ON signal stays input to the gate of the IGBT 1 over a predetermined time period, the timer circuit 7 outputs an H-level signal. Then, the NMOS transistor 30 transitions to the ON state, causing the Zener diode 28 to be connected between the gate and collector of the IGBT 1.

Since the breakdown voltage in the Zener diode 28 is set lower than that of the Zener diode 3. The gate-collector voltage in the IGBT 1 is clamped by the Zener diode 28 in the protecting operation. Appropriately selecting the breakdown of the Zener diode 28, the clamping voltage in the protecting operation can be set at a desired value with high accuracy.

In the above configuration, an IGBT is used as a switching device, however, the present invention is also applicable to a semiconductor device using a power MOSFET or the like. Further, the circuit area can be reduced by forming the components except the load coil 2 on the same semiconductor substrate.

Fourth Preferred Embodiment

Figure 10:
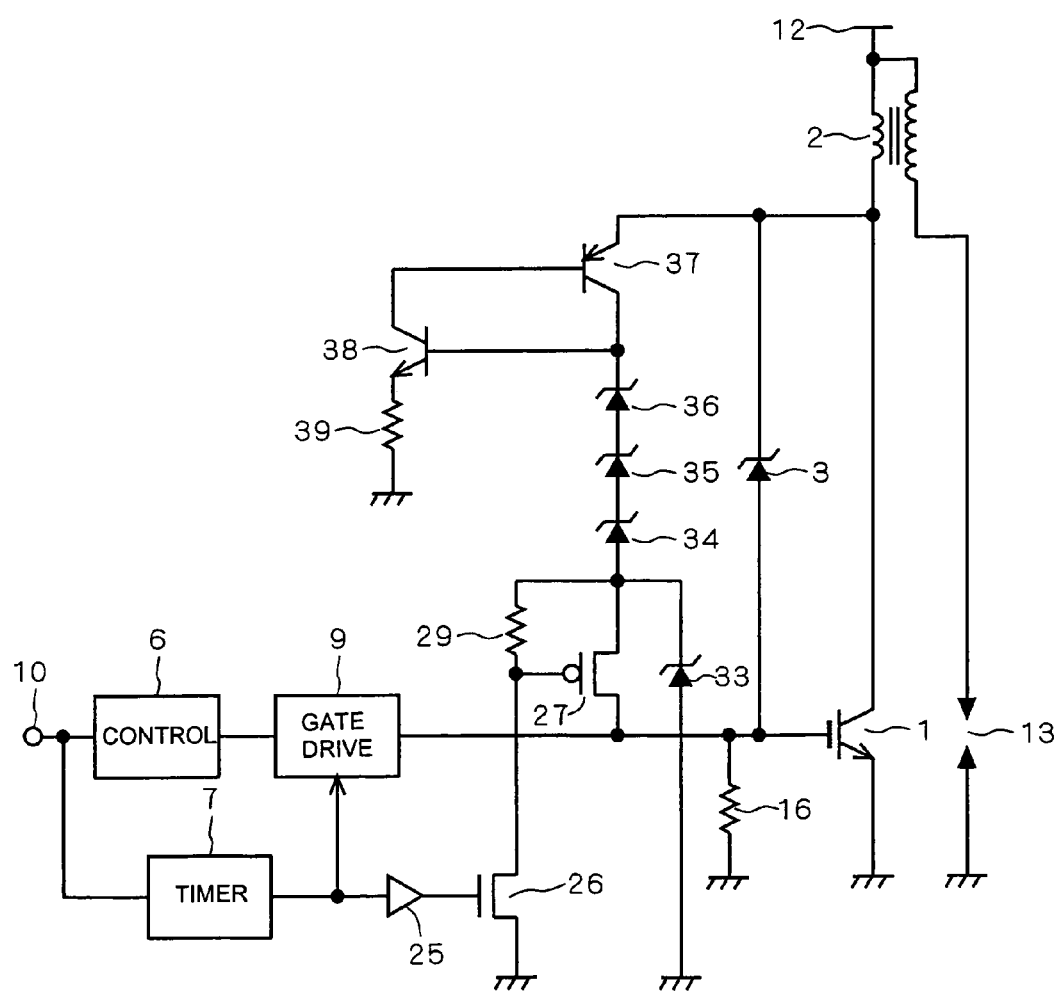
FIG. 10 is a circuit diagram showing a configuration of a semiconductor device according to a fourth preferred embodiment of the present invention.

FIG. 10 is a circuit diagram showing a configuration of a semiconductor device according to the present embodiment. A PNP transistor (first transistor) 37 has its emitter connected to the cathode of the Zener diode 3 and its collector (current input terminal) connected to the base of an NPN transistor (second transistor) 38 and the cathode of a Zener diode 36. The PNP transistor 37 has its base connected to the collector of the NPN transistor 38, and the NPN transistor 38 has its emitter (current output terminal) connected to one end of a resistor 39. The other end of the resistor 39 is grounded.

Here, the PNP transistor 37 and NPN transistor 38 constitute a thyristor, and the resistor 39 is provided to prevent latch-up of the thyristor. Further, the PNP transistor 37 may be constructed using a parasitic PNP transistor of the IGBT 1 as disclosed in Japanese Patent Application Laid-Open No. 2000-183341.

A Zener diode 35 has its cathode connected to the anode of the Zener diode 36 and its anode connected to the cathode of a Zener diode 34. The Zener diode 34 has its anode connected to one end of the resistor 29, the drain (current output terminal) of the PMOS transistor (third transistor, transistor) 27 and the cathode of a Zener diode 33 (third clamping device). The anode of the Zener diode 33 is grounded.

Since other configuration is the same as that described in the third preferred embodiment, similar components are indicated by the same reference numbers, and repeated explanation is omitted here.

The operation of the semiconductor device according to the present embodiment will be described now. First, the process of the normal operation will be described. Upon receipt of an ON signal through the input terminal 10, the IGBT 1 transitions from the OFF state to the ON state. At this time, the timer circuit 7 outputs an L-level signal, bringing the NMOS transistor 26 into the OFF state.

With the transition of the IGBT 1 to the ON state, the collector current IC gradually flows out from the power source 12 through the IGBT 1. At this time, part of the collector current IC becomes emitter current in the NPN transistor 37, causing the thyristor including the NPN transistor 37 and PNP transistor 38 to transition to the ON state. Then, current flows to the ground potential through the NPN transistor 37, PNP transistor 38 and resistor 39.

Next, the transition of the IGBT 1 to the OFF state causes the collector current IC to be abruptly interrupted, so that the collector-emitter voltage VCE rises. At this time, current does not flow into the PNP transistor 37 because of the abrupt interruption of the collector current IC, bringing the thyristor into the OFF state. Therefore, the Zener diodes 33 to 36 are disconnected from the semiconductor device when the IGBT 1 is in the OFF state. This causes the voltage VCE to be clamped by the Zener diode 3. When the voltage VCE rises up to about the same level as the clamping voltage in the Zener diode 3, arc discharge takes place in the ignition coil 13.

Next, the protecting operation according to the present embodiment will be described. When an ON signal stays input over a predetermined time period, the timer circuit 7 outputs an H-level signal. The output of the timer circuit 7 is input to the gate of the NMOS transistor 26 through the gate driving circuit 9 and buffer circuit 25.

Upon receipt of the H-level signal from the timer circuit 7, the NMOS transistor 26 is brought into the OFF state, and the gate of the PMOS transistor 27 is grounded through the NMOS transistor 26, thus bought into the ON state. As a result, the Zener diodes 34 to 36 are connected between the gate and collector of the IGBT 1 through the PNP transistor 37.

Further, upon receipt of the H-level signal from the timer circuit 7, the gate driving circuit 9 drives the IGBT 1 into the OFF state. Therefore, the collector current IC is abruptly interrupted, causing the collector-emitter voltage VCE to rise.

As described above, the Zener diodes 34 to 36 are connected between the gate and collector of the IGBT 1 through the PNP transistor 37. The PNP transistor 37 is in the ON state, and therefore has a collector voltage (a base voltage in the NPN transistor 38) nearly equal to the collector-emitter voltage VCE in the IGBT 1. Therefore, the voltage VCE is clamped at a breakdown voltage of the Zener diodes 34 to 36. The number of levels of Zener diodes used here may be varied in accordance with a desired voltage value.

Current flowing through the Zener diodes 34 to 36 is limited by the thyristor including the NPN transistor 37 and PNP transistor 38. Therefore, the Zener diodes 34 to 36 are not broken down due to large current.

In the semiconductor device according to the present embodiment, the circuit area can be reduced by using a parasitic PNP transistor of the IGBT 1 as the PNP transistor 37.

In the semiconductor device according to the second preferred embodiment, a rise in the collector-emitter voltage VCE in the OFF operation of the IGBT 1 causes a high voltage to be applied between the source and drain of the PMOS transistor 27. Therefore, a PMOS transistor of high breakdown voltage needs to be used as the PMOS transistor 27, which causes an increase in circuit area.

In the present embodiment, voltage applied to the PMOS transistor 27 is limited by the Zener diode 33 to no more than the breakdown voltage in the Zener diode 33. Thus, a PMOS transistor of low breakdown voltage can be used as the PMOS transistor 27. As a result, the circuit area can be reduced.

In the above configuration, an IGBT is used as a switching device, however, the present invention is also applicable to a semiconductor device using a power MOSFET or the like. Further, the circuit area can be reduced by forming the components except the load coil 2 on the same semiconductor substrate.

Fifth Preferred Embodiment

Figure 11:
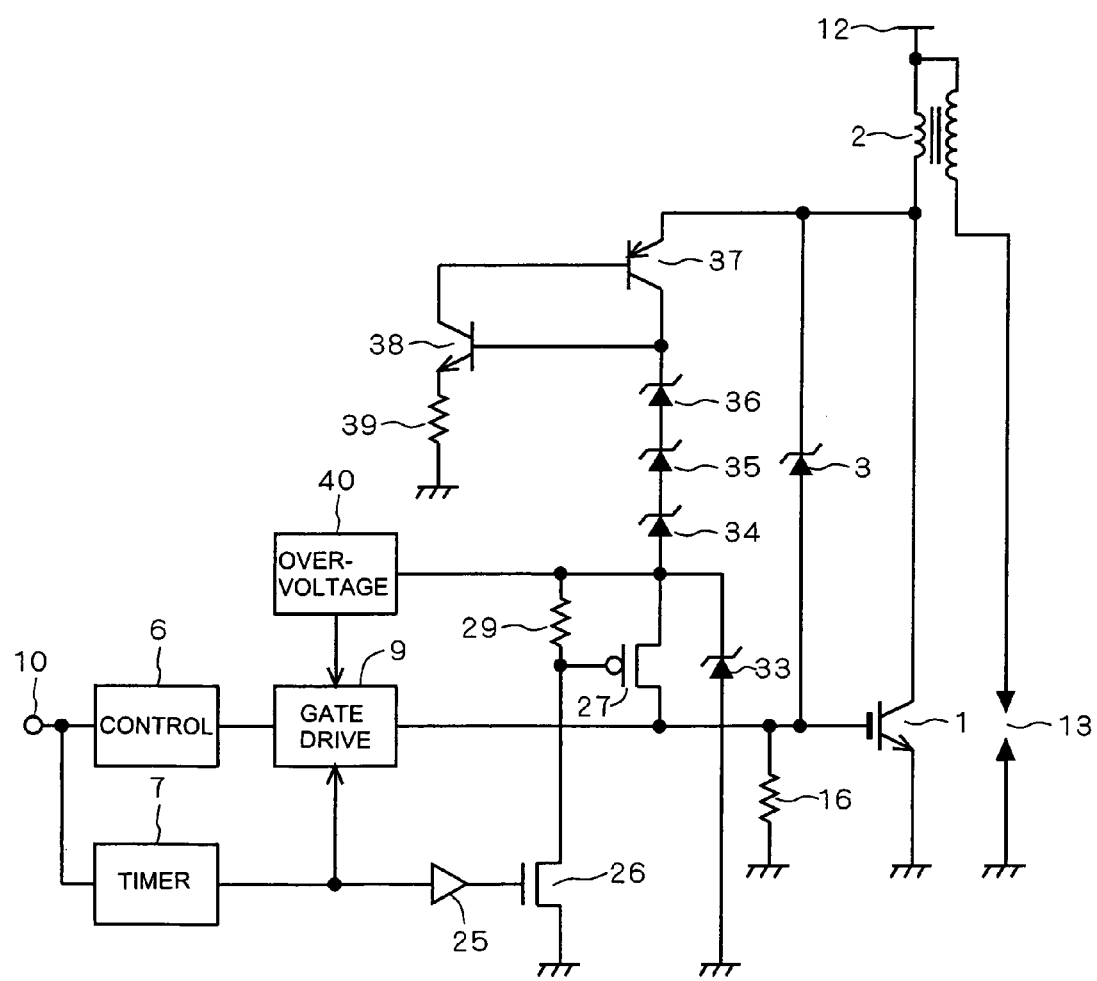
FIG. 11 is a circuit diagram showing a configuration of a semiconductor device according to a fifth preferred embodiment of the present invention.

FIG. 11 is a circuit diagram showing a configuration of a semiconductor device according to the present embodiment.

An overvoltage detecting circuit 40 has its input connected to the cathode of the Zener diode 33 and its output input to the gate driving circuit 9.

Since other configuration is the same as that described in the fourth preferred embodiment, similar components are indicated by the same reference numbers, and repeated explanation is thus omitted here.

Figure 12:
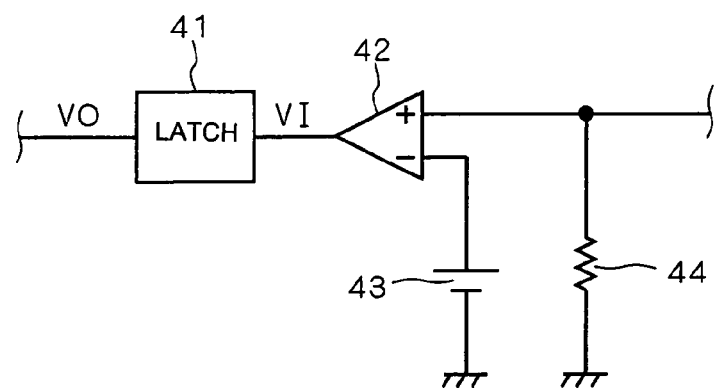
FIG. 12 is a circuit diagram showing a configuration of an overvoltage detecting circuit for use in the semiconductor device according to the fifth preferred embodiment.

FIG. 12 is a circuit diagram showing a configuration of the overvoltage detecting circuit 40. One end of a resistor 44 and the cathode of the Zener diode 33 are connected to the plus terminal of a comparator 42. The other end of the resistor 44 is grounded.

A reference power source 43 is connected to the minus terminal of the comparator 42. The voltage in the reference power source 43 is set at a value smaller than the breakdown voltage in the Zener diode 33. The comparator 42 has its output connected to the input of a latch circuit 41, and the latch circuit 41 has its output input to the gate driving circuit 9.

Figure 13:
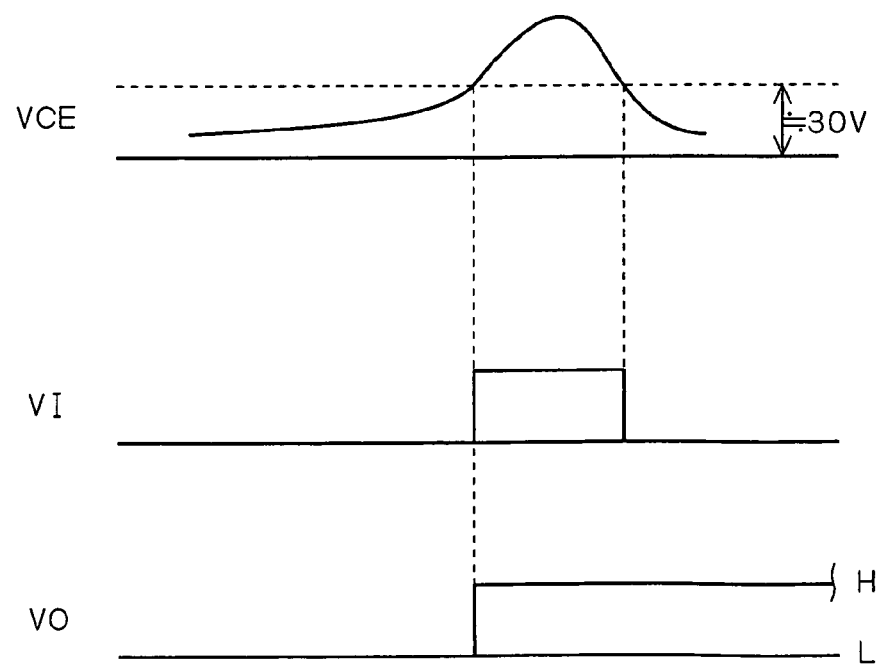
FIG. 13 is a waveform chart of an operation of the semiconductor device according to the fifth preferred embodiment.

Referring to FIG. 13, the operation of the semiconductor device according to the present embodiment will be described now. In the case where the voltage VCE is not greater than a breakdown voltage given by the Zener diodes 33 to 36 (e.g., approximately 30V) during the ON operation of the IGBT 1, voltage input to the plus terminal of the comparator 42 becomes approximately zero volts, which is lower than a reference voltage. As a result, the comparator 42 outputs an L-level signal. The latch circuit 41 also continues outputting an L-level signal.

When some unusual event occurs to cause the collector-emitter voltage VCE to rise above the breakdown voltage given by the Zener diodes 33 to 36 (e.g., approximately 30V) during the ON operation of the IGBT 1, current flows out from the collector of the IGBT 1 to the Zener diode 33 and resistor 44 through the PNP transistor 37 and Zener diodes 34 to 36. As a result, voltage equal to the breakdown voltage in the Zener diode 33 is input to the plus terminal of the comparator 42.

When the voltage input to the plus terminal of the comparator 42 exceeds the reference voltage, the comparator 42 outputs an H-level signal. Upon receipt of the output from the comparator 42, the latch circuit 41 outputs an H-level signal. Then, the latch circuit 41 continues outputting the H-level signal even when the voltage VCE drops.

Upon receipt of the output from the overvoltage detecting circuit 40 (i.e., the output from the comparator 42), the gate driving circuit 9 drives the IGBT 1 into the OFF state. Other operation is the same as that described in the third preferred embodiment, explanation of which is thus omitted here.

In the case where the voltage VCE rises when the IGBT 1 is in the ON state, large collector current IC flows into the IGBT 1, which may cause thermal breakdown of the IGBT 1.

In the present embodiment, in the case where the overvoltage detecting circuit 40 detects a reverse conducting voltage in the Zener diode 33 before the timer circuit 7 outputs an H-level signal, the gate driving circuit 9 outputs an OFF signal, causing the IGBT 1 to transition to the OFF state. This avoids breakdown of the IGBT 1 due to combustion.

In the above configuration, an IGBT is used as a switching device, however, the present invention is also applicable to a semiconductor device using a power MOSFET or the like. Further, the circuit area can be reduced by forming the components except the load coil 2 on the same semiconductor substrate.

In the present embodiment, the overvoltage detecting circuit 40 is added to the configuration described in the fourth preferred embodiment (see FIG. 10), however, this is not a restrictive example, and the present embodiment is also applicable to another configuration. It is only required that the one end of the overvoltage detecting circuit 40 be connected to the cathode of the Zener diode 33 and that the IGBT 1 be driven into the OFF state by the output of the overvoltage detecting circuit 40. Even if other configuration is different, similar effects are achieved.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a switching device having a current input terminal connected to an inductive load;
   a clamping device connected between a control terminal and the current input terminal of said switching device; and
   a discharge resistor part having a resistance component between the control terminal of said switching device and a ground potential, wherein
   said switching device is driven to generate an induced electromotive force in said inductive load,
   said semiconductor device further comprising
   a timer circuit for outputting a predetermined signal to said discharge resistor part when an ON signal for driving said switching device into an ON state stays input over a predetermined time period, wherein
   said discharge resistor part changes a resistance of said resistance component to a greater value in response to said predetermined signal.

2. The semiconductor device according to claim 1, further comprising
   a second clamping device selectively connectable between the control terminal and the current input terminal of said switching device, wherein
   said second clamping device is connected between the control terminal and the current input terminal of said switching device in response to said predetermined signal.

3. The semiconductor device according to claim 1 being formed on the same semiconductor substrate.

4. A semiconductor device comprising:
   a switching device having a current input terminal connected to an inductive load;
   a first clamping device connected between a control terminal and said current input terminal of said switching device; and
   a discharge resistor part having a resistance component between the control terminal of said switching device and a ground potential, wherein
   said switching device is driven to generate an induced electromotive force in said inductive load,
   said semiconductor device further comprising:
   a timer circuit for outputting a predetermined signal when an ON signal for driving said switching device into an ON state stays input over a predetermined time period; and
   a second clamping device selectively connected between the control terminal and the current input terminal of said switching device in response to said predetermined signal, wherein said second clamping device has a breakdown voltage smaller than a breakdown voltage in said first clamping device.

5. The semiconductor device according to claim 4 being formed on the same semiconductor substrate.

6. The semiconductor device according to claim 4, further comprising:
   a first transistor having a current input terminal connected to the current input terminal of said switching device;
   a second transistor constituting a thyristor together with said first transistor;
   a resistor having one end connected to a current input terminal of said second transistor and the other end grounded;
   a third transistor having a current input terminal connected to said second clamping device and a current output terminal connected to the control terminal of said switching device; and
   a third clamping device having one end connected to the current input terminal of said third transistor and the other end connected to said ground potential, wherein
   said second clamping device is connected between the control terminal and the current input terminal of said switching device through conduction of said third transistor in response to said predetermined signal.

7. The semiconductor device according to claim 6, further comprising
   an overvoltage detecting circuit connected to the one end of said third clamping device, wherein
   said overvoltage detecting circuit outputs a signal for driving said switching device into an OFF state when a breakdown voltage is applied to said third clamping device.

8. A semiconductor device comprising:
   a switching device having a current input terminal connected to an inductive load;
   a first clamping device connected between a control terminal and the current input terminal of said switching device; and
   a discharge resistor part having a resistance component between the control terminal of said switching device and a ground potential, wherein
   said switching device is driven to generate an induced electromotive force in said inductive load,
   said semiconductor device further comprising:
   a second clamping device having one end connected to the current input terminal of said switching device;
   a transistor having a current input terminal connected to the other end of said second clamping device and a current output terminal connected to the control terminal of said switching device;
   a third clamping device having one end connected to the current input terminal of said transistor and the other end connected to said ground potential; and
   an overvoltage detecting circuit connected to said one end of said third clamping device, wherein
   said overvoltage detecting circuit outputs a signal for driving said switching device into an OFF state when a breakdown voltage is applied to said third clamping device.

9. The semiconductor device according to claim 8 being formed on the same semiconductor substrate.

\* \* \* \* \*